US007662656B2

(12) United States Patent
Ford

(10) Patent No.: US 7,662,656 B2
(45) Date of Patent: Feb. 16, 2010

(54) LIGHT BLOCK FOR PIXEL ARRAYS

(75) Inventor: Loriston Ford, Nampa, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 547 days.

(21) Appl. No.: 11/496,418

(22) Filed: Aug. 1, 2006

(65) Prior Publication Data

US 2006/0263926 A1 Nov. 23, 2006

Related U.S. Application Data

(62) Division of application No. 10/924,776, filed on Aug. 25, 2004, now Pat. No. 7,335,963.

(51) Int. Cl.
*H01L 21/00* (2006.01)
(52) U.S. Cl. .............................. 438/57; 438/65; 438/72; 438/48
(58) Field of Classification Search ................. 438/65, 438/69, 72, 48, 163, 188, 199, 200, 203, 438/128, 129, 429, 57
See application file for complete search history.

(56) References Cited

U.S. PATENT DOCUMENTS

| 6,057,538 A | 5/2000 | Clarke |
| 6,333,205 B1 | 12/2001 | Rhodes |
| 6,335,540 B1 * | 1/2002 | Zhang ........................ 257/53 |
| 6,573,488 B1 * | 6/2003 | Takeshita et al. .......... 250/214.1 |
| 6,611,013 B2 | 8/2003 | Rhodes |
| 6,812,059 B2 * | 11/2004 | Kang et al. .................... 438/57 |
| 6,812,539 B1 | 11/2004 | Rhodes |
| 7,348,133 B2 * | 3/2008 | Tomizawa et al. ............ 430/313 |
| 2001/0042876 A1 | 11/2001 | Wester |
| 2005/0007669 A1 | 1/2005 | Sakai |
| 2005/0056901 A1 | 3/2005 | Kuriyama |
| 2006/0006485 A1 | 1/2006 | Mouli |

\* cited by examiner

*Primary Examiner*—Chuong A. Luu
(74) *Attorney, Agent, or Firm*—Dickstein Shapiro LLP

(57) ABSTRACT

Imager devices are formed with light block material between microlenses to enhance the characteristics of image acquisition. The light block material may be deposited over the lenses, and then partially removed to expose central portions of the lenses. The invention is applicable to, among other things, imager devices having pixel arrays formed with the light block material and integrated with one or more processing components in a semiconductor device.

38 Claims, 6 Drawing Sheets

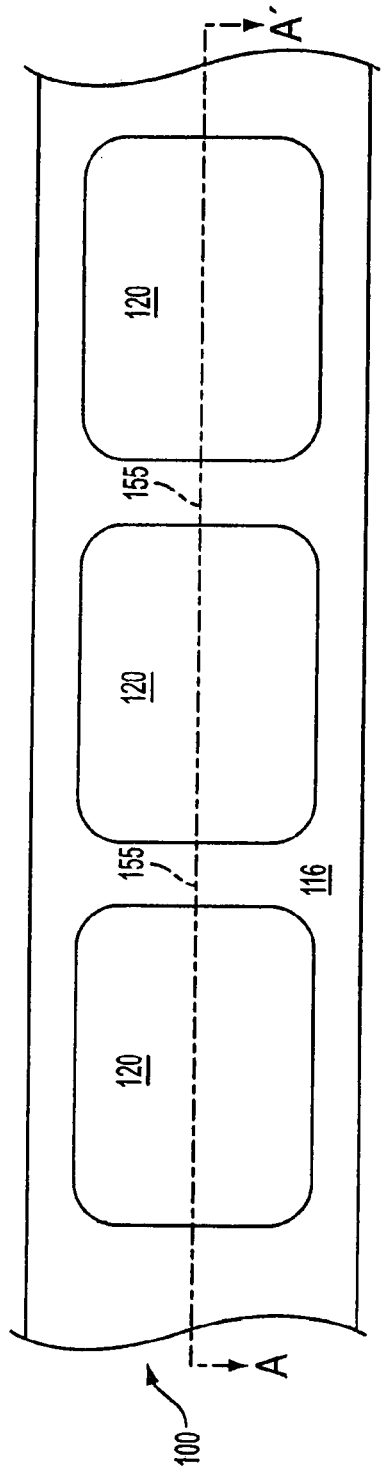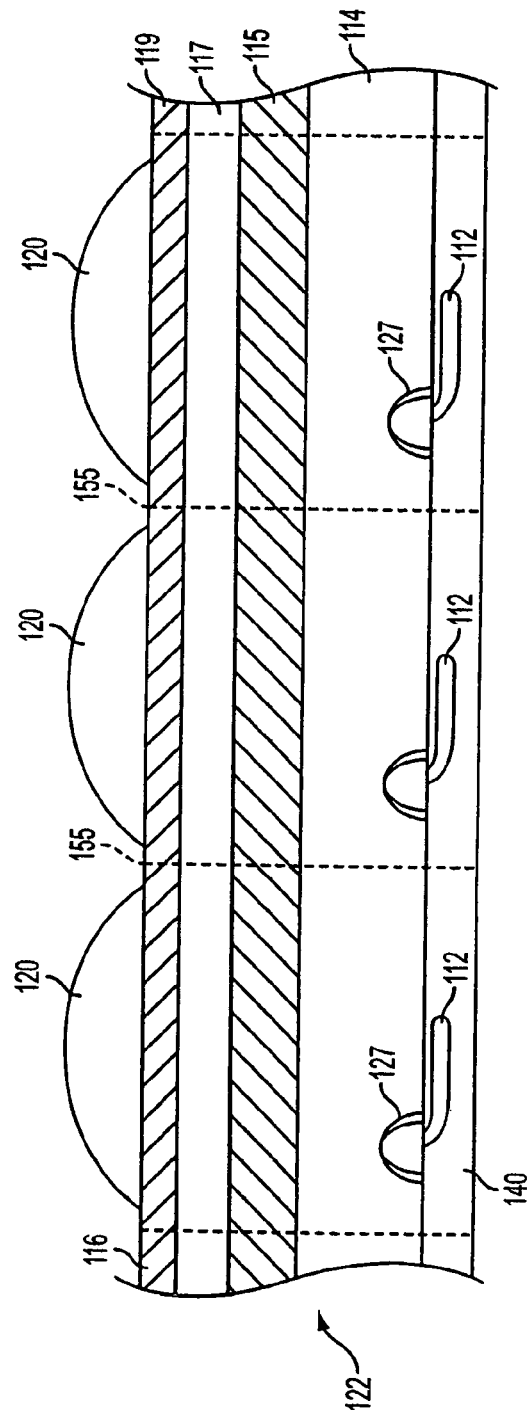
FIG. 1A
FIG. 1B

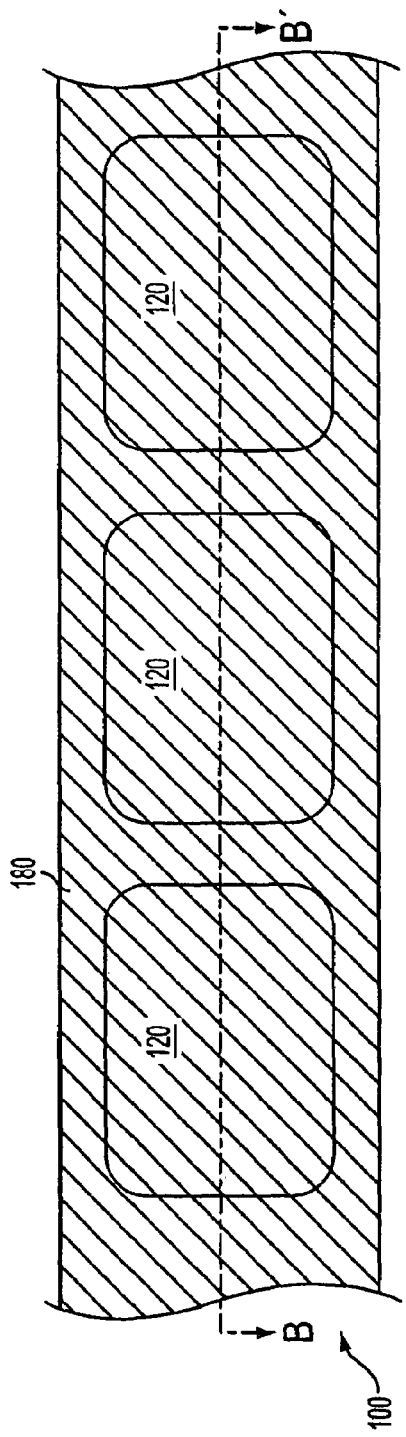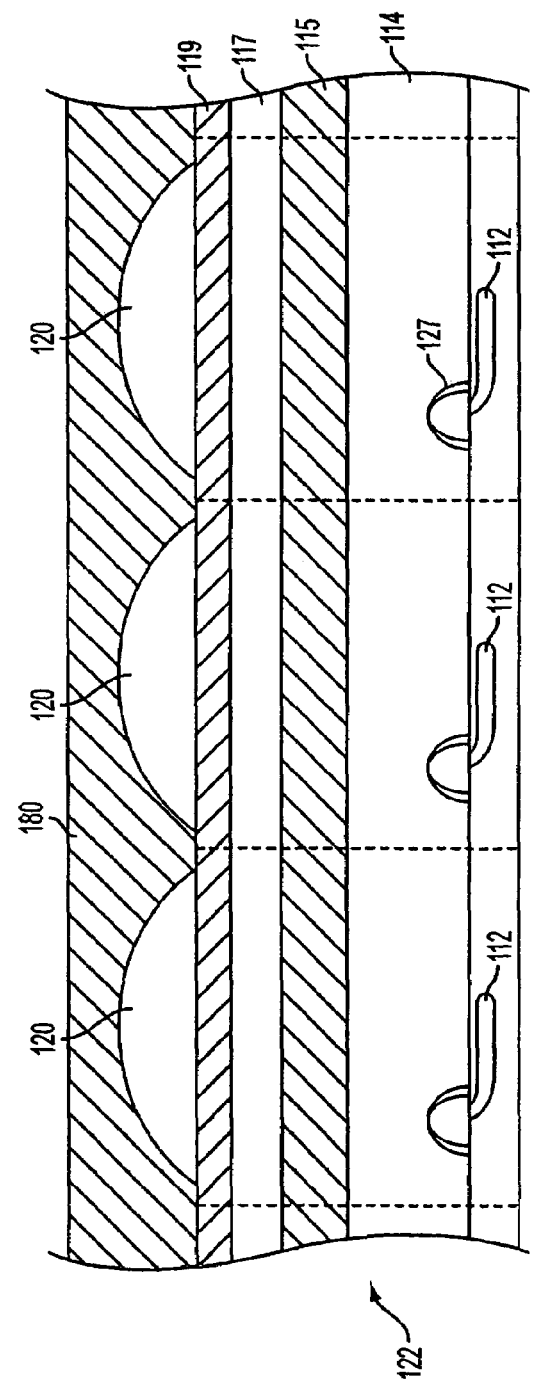

LIGHT BLOCK FOR PIXEL ARRAYS

CROSS REFERENCE TO RELATED APPLICATIONS

The present application is a divisional of U.S. patent application Ser. No. 10/924,776, filed on Aug. 25, 2004 now U.S. Pat. No. 7,335,963, the disclosure of which is incorporated by reference in its entirety.

FIELD OF THE INVENTION

The present invention relates to imaging devices and in particular to a light block material and method of forming a light block for use in imaging devices.

BACKGROUND OF THE INVENTION

There are a number of different types of semiconductor-based imagers, including charge coupled devices (CCDs), photodiode arrays, charge injection devices and hybrid focal plane arrays. CCDs are often employed for image acquisition in small size imaging applications. CCDs are also capable of large formats with small pixel size and they employ low noise charge domain processing techniques. However, CCD imagers have a number of disadvantages. For example, they are susceptible to radiation damage, they exhibit destructive read out over time, they require good light shielding to avoid image smear and they have a high power dissipation for large arrays.

Because of the inherent limitations in CCD technology, there is an interest in complementary metal oxide semiconductor (CMOS) imagers for possible use as low cost imaging devices. A fully compatible CMOS sensor technology enabling a higher level of integration of an image array with associated processing circuits would be beneficial to many digital applications such as, for example, in cameras, scanners, machine vision systems, vehicle navigation systems, video telephones, computer input devices, surveillance systems, auto focus systems, star trackers, motion detection systems, image stabilization systems and data compression systems for high-definition television.

A typical CMOS imager includes a focal plane array of pixel cells, each one of the cells including either a photodiode, a photogate or a photoconductor overlying a doped region of a substrate for accumulating photo-generated charge in the underlying portion of the substrate.

In a CMOS imager, the active elements of a pixel cell perform the necessary functions of: (1) photon to charge conversion; (2) accumulation of image charge; (3) transfer of charge to a floating diffusion region accompanied by charge amplification; (4) resetting the floating diffusion region to a known state before the transfer of charge to it; (5) selection of a pixel for readout; and (6) output and amplification of a signal representing pixel charge. The charge at the floating diffusion region is typically converted to a pixel output voltage by a source follower output transistor.

There is a need for an effective light blocking structure in imagers which, as discussed below, can reduce the cross-talk and optical noise caused by stray light during image acquisition.

Accordingly, an improved imaging device capable of minimizing if not eliminating cross-talk and optical noise caused by stray light during image acquisition is needed. There is also a need for an improved method for fabricating imaging devices, in which there is reduced cross-talk and optical noise during image acquisition.

SUMMARY OF THE INVENTION

Exemplary embodiments of the invention provide an imaging device, in which a light blocking material is provided between the lenses of a pixel array. The material provided can either absorb or reflect light to block light transmitted between the lenses from reaching the photosensors. In this manner, the material blocks substantially all light transmitted between the lenses, and thus reduces crosstalk and optical noise.

In another exemplary embodiment, a light blocking material is formed surrounding each lens of a pixel array, such that at least an outer portion of each lens remains uncovered by the material. In this manner, the light blocking material reduces cross-talk and optical noise, and the uncovered part of each lens focuses light in an efficient manner.

Also provided are methods of forming an imaging device. In one exemplary method embodiment, an imaging device is produced by forming at least one light blocking material between each lens of a pixel array, in order to reduce cross-talk and optical noise.

BRIEF DESCRIPTION OF THE DRAWINGS

These and other features and advantages of the invention will be more apparent from the following detailed description that is provided in connection with the accompanying drawings and illustrated exemplary embodiments of the invention, in which:

FIG. 1A is a view of a device at the beginning of the formation of a pixel array in accordance with the invention;

FIG. 1B is a schematic cross-sectional view of the FIG. 1A device taken along line A-A';

FIG. 2A is a view of the FIG. 1A device formed at a stage of processing subsequent to that shown in FIG. 1A;

FIG. 2B is a schematic cross-sectional view of the FIG. 2A device taken along line B-B';

DETAILED DESCRIPTION OF PREFERRED EMBODIMENTS

Figure 3A:
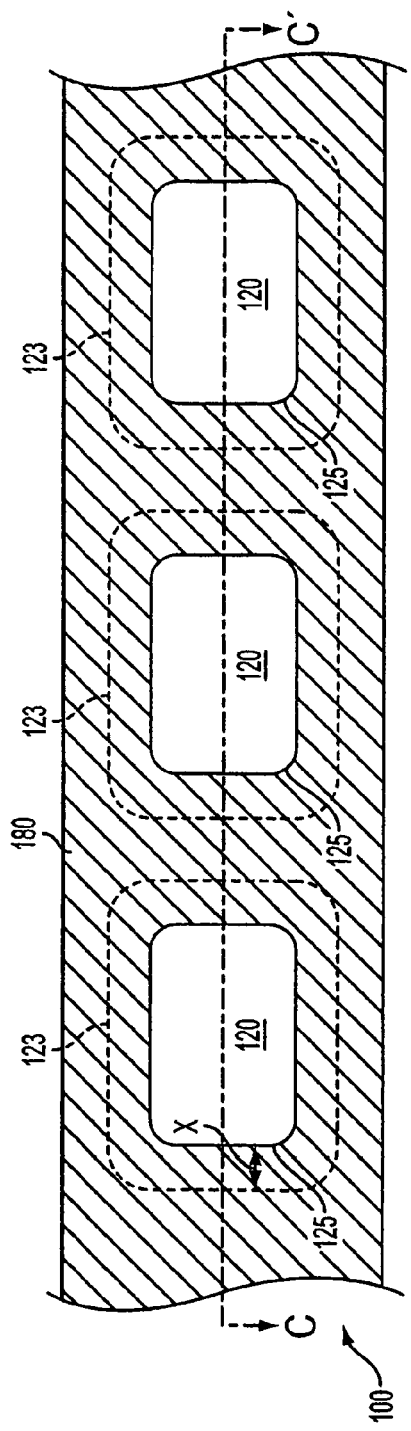
FIG. 3A is a schematic view of the FIG. 1A device formed at a stage of processing subsequent to that shown in FIG. 2A.

In the following detailed description, reference is made to various specific embodiments in which the invention may be practiced. These embodiments are described with sufficient detail to enable those skilled in the art to practice the invention, and it is to be understood that other embodiments may be employed, and that structural and logical changes may be made without departing from the spirit or scope of the present invention.

The terms "substrate" and "wafer" can be used interchangeably in the following description and may include any semiconductor-based structure. The structure should be understood to include silicon, silicon-on insulator (SOI), silicon-on-sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to the substrate in the following description, previous process steps may have been utilized to form regions or junctions in or over the base semiconductor or foundation.

The term "pixel" refers to a discrete picture element unit cell containing a photoconductor and transistors for converting electromagnetic radiation to an electrical signal. For purposes of illustration, a representative pixel array is illustrated in the figures and description herein. An array or combination of pixels together comprise a pixel array for use in a CMOS imager device. Typically, fabrication of all pixel arrays in an imager will proceed simultaneously in a similar fashion.

Now referring to the figures, where like reference numbers designate like elements, FIG. 1A depicts a top view of a section of a pixel array 100 comprising a plurality of lenses 120 formed over a base layer, for example a polyimide layer 116. At this initial stage of processing, gaps 155 remain between each lens 120. Alternatively, not all lens arrays have gaps between the lenses. The methods of the invention may also be used with arrays having no gaps between the lenses.

FIG. 1B depicts a schematic cross-sectional view of the FIG. 1A array 100 taken along line A-A'. The substrate 140 of imager 122 may comprise integrated circuits and other semiconductor components that are typically incorporated into an imager device. FIG. 1B depicts photosensor 112 near the surface of the semiconductor substrate 140. Photosensors 112 may be formed beneath the surface of the substrate 140. Photosensors 112 may be fabricated using conventional techniques and are shown to illustrate one environment of many in which the present invention may be employed.

FIG. 1B also shows a transfer gate 127 formed within each pixel. For clarity, other devices are not shown in FIG. 1B. After formation of pixels in array 100, the array 100 is covered with one or more insulating layers, for example layer 114. Layer 114 may comprise, for example, silicon dioxide (SiO$_2$), boro-phospho-silicate glass (BPSG), or other suitable insulating materials. An interlayer dielectric (ILD) 115 is then formed over layer 114. Although only one ILD layer 115 is shown, more than one ILD layer may be formed. In addition, a passivation layer 117 is formed comprising, for example, a phospho-silicate-glass (PSG), silicon nitride or oxynitride. Although only one passivation layer 117 is shown, more than one passivation layer may be formed.

A color filter 119 is then formed over each pixel. In the embodiment shown in FIG. 1B, each color filter 119 is formed between a photosensor 112 and a corresponding lens 120. Each color filter 119 may be formed from a pigmented or dyed material that will only allow a narrow band of light to pass through, for example, red, blue, or green.

Lenses 120 are formed above the color filters 119. As shown in FIG. 1B, each lens 120 is formed over a corresponding photosensor 112 (which may be a photodiode, photogate, etc.). Although the lenses 120 are shown as having a generally rounded or curved outer surface, the lenses 120 may be formed in any desired shape and/or size suitable for the reception of incoming light.

The process for making exemplary pixel arrays with light block materials according to the invention will now be described with reference to FIGS. 2-4. With reference to FIGS. 2A, 2B, 3A, 3B, 4A and 4B, like numerals correspond to like numbered parts as described above, with reference to FIGS. 1A and 1B.

Turning to FIG. 2A, after formation and processing of the lenses 120, a light block material 180 is applied to the array 100 at a thickness sufficient to cover the lenses 120. The application of material 180 may be performed using conventional techniques, including for example surface deposition and micromachining processes.

Different materials can be used to form the light block material 180. For example, the light block material 180 may comprise any material that substantially operates to either absorb or reflect incoming light. For example, the light block material 180 may comprise at least one layer of black photoresist, or at least one metal layer, such as aluminum. A suitable metal alloy may also be used. The light block material 180 may also comprise a suitable hard coat material deposited with at least one metal or metal alloy. Light block material 180 can also be used with any other suitable, non-metallic materials to block stray light. Light block material 180 may also be formed over any type of lens arrangement including, but not limited to, curved lens as depicted in FIGS. 1-4, or any other shaped lenses of any size and number.

The light block material 180 may be applied by any suitable technique, including one or more spin-on techniques or any other technique for material deposition. The light block material 180 may comprise any reflective or high optical density material which can be applied after microlens processing. For example, a high optical density material, such as black photoresist, may be applied by coating over a lens array, then ashed leaving the material over and between each lens, as shown in FIG. 2B. As shown in FIG. 2B, a layer of light block material 180 is deposited in a substantially uniform manner over and between each lens 120 to any desired thickness.

Figure 3B:
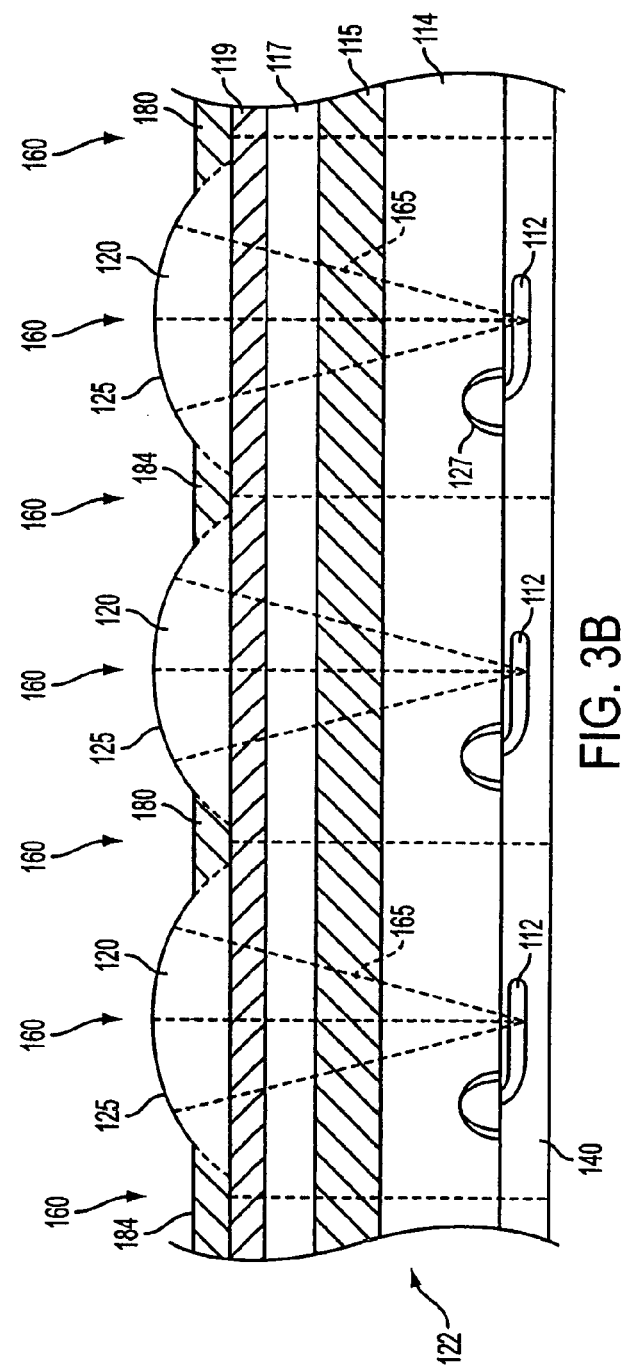
FIG. 3B is a schematic cross-sectional view of the FIG. 3A device taken along line C-C'.

Turning to FIGS. 3A and 3B, further processing is performed to remove a portion of the light block material 180 in a substantially uniform manner to expose the outer surface 125 of each lens 120, while leaving a remaining portion 184 (FIG. 3B) of the light block material 180 surrounding and in between each lens 120. Dashed lines 123 represent the outer portion of each lens 120 that is covered by light block material 180. The total area of each lens 120 that is covered by the light block material 180, as shown in FIG. 3A, is represented by the area between dashed lines 123 and the exposed outer surface 125 of each lens 120. Width "X" represents one portion of this total area for each covered lens 120, i.e. the area between dashed lines 123 and the exposed outer surface 125 of each lens 120. Removal of the portions of the light block material 180 may be accomplished using any suitable technique, including etching, until the desired thickness of portion 184 remains between lenses 120.

A sufficient amount of light block material 180 is removed until enough of the outer surface 125 of each lens 120 is exposed to efficiently focus incoming light 160. The residual light blocking material 184 is left between the lenses 120 where light is not to be collected. This substantially prevents unwanted light from entering the pixels, and thus reduces the optical noise of the imager.

As shown in FIG. 3B, incoming light 160 is transmitted to the outer surface 125 of each lens 120, and then the light 160 is focused 165 and propagated by each lens 120 to the photosensor 112. Each lens 120 formed may receive and propagate light within an interior space of the lens to at least one photosensor 112.

Although FIG. 3B depicts light block portions 184 as each having a generally horizontal planar surface, it must be noted that the light block portions 184 are not limited in shape or dimensions to the depiction in the accompanying figures, but instead can be formed, for example, by any suitable etching technique, to any shape and dimensions desired.

Figure 4A:
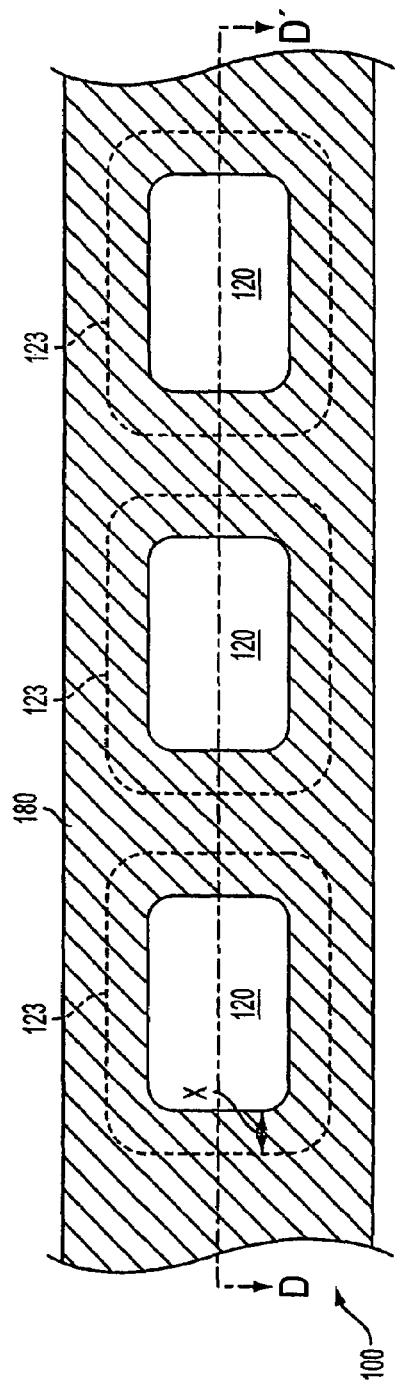
FIG. 4A is an alternate view of the FIG. 1A device formed at a stage of processing subsequent to that shown in FIG. 2A, wherein different size light block sections are formed between each lens.

FIG. 4A depicts a different embodiment after further processing of the FIG. 2A device. As shown in FIG. 4A, further processing, for example by planarization and etching, may leave a remaining portion 194 (FIG. 4B) of light block material 180 surrounding and in between each lens 120. For example, a deposited layer of metal may be planarized and then etched, leaving a metal portion 194 at a level higher than the lens 120 (depicted as distance "Y" in FIG. 4B) and surrounding and in between each lens 120. As shown in FIG. 4B, incoming light 160 is transmitted to the outer surface 125 of each lens 120, and the light 160 is focused 165 and propagated by each lens 120 to a photosensor 112.

Figure 4B:
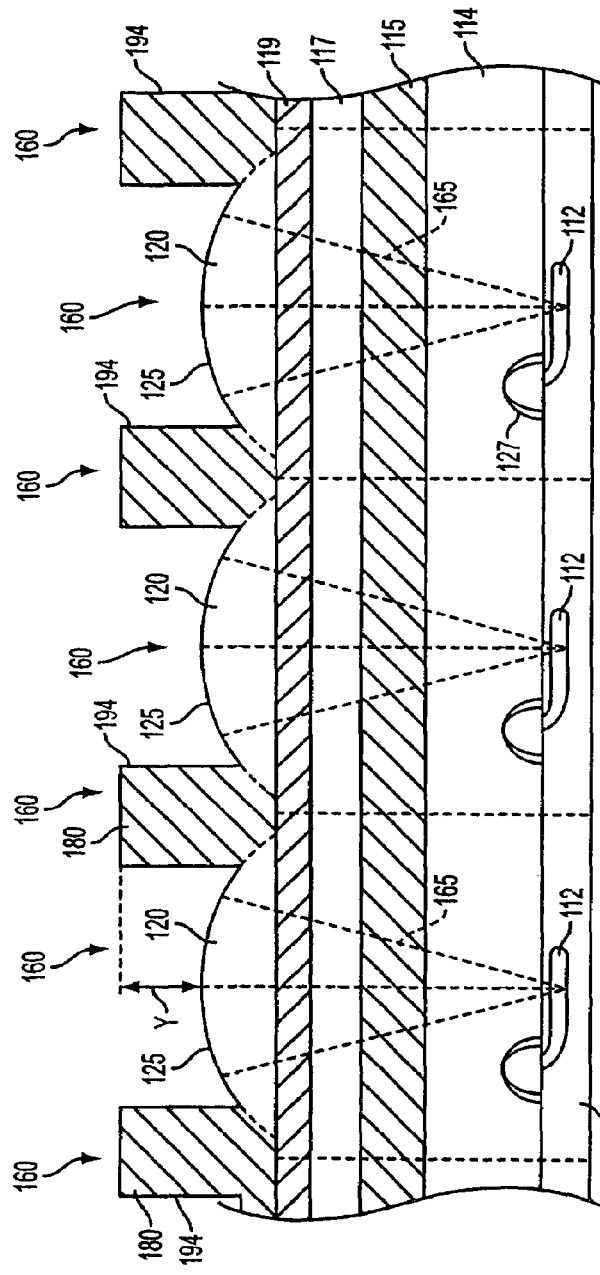
FIG. 4B is a schematic cross-sectional view of the FIG. 4A device taken along line D-D'.

Although FIG. 4B depicts light block portions 194 as each having a generally horizontal planar surface, and generally vertical sidewalls, it must be noted that the light block portions 194 are not limited in shape or dimensions to the depiction in the accompanying figures, but instead can be formed to any shape and dimensions desired. The light block portions 194 can, for example, each have concave or convex curved upper surfaces and sidewall surfaces.

Any combination or array of pixels can be formed for color processing and imaging by a CMOS imaging device formed in accordance with the present invention.

Figure 5:
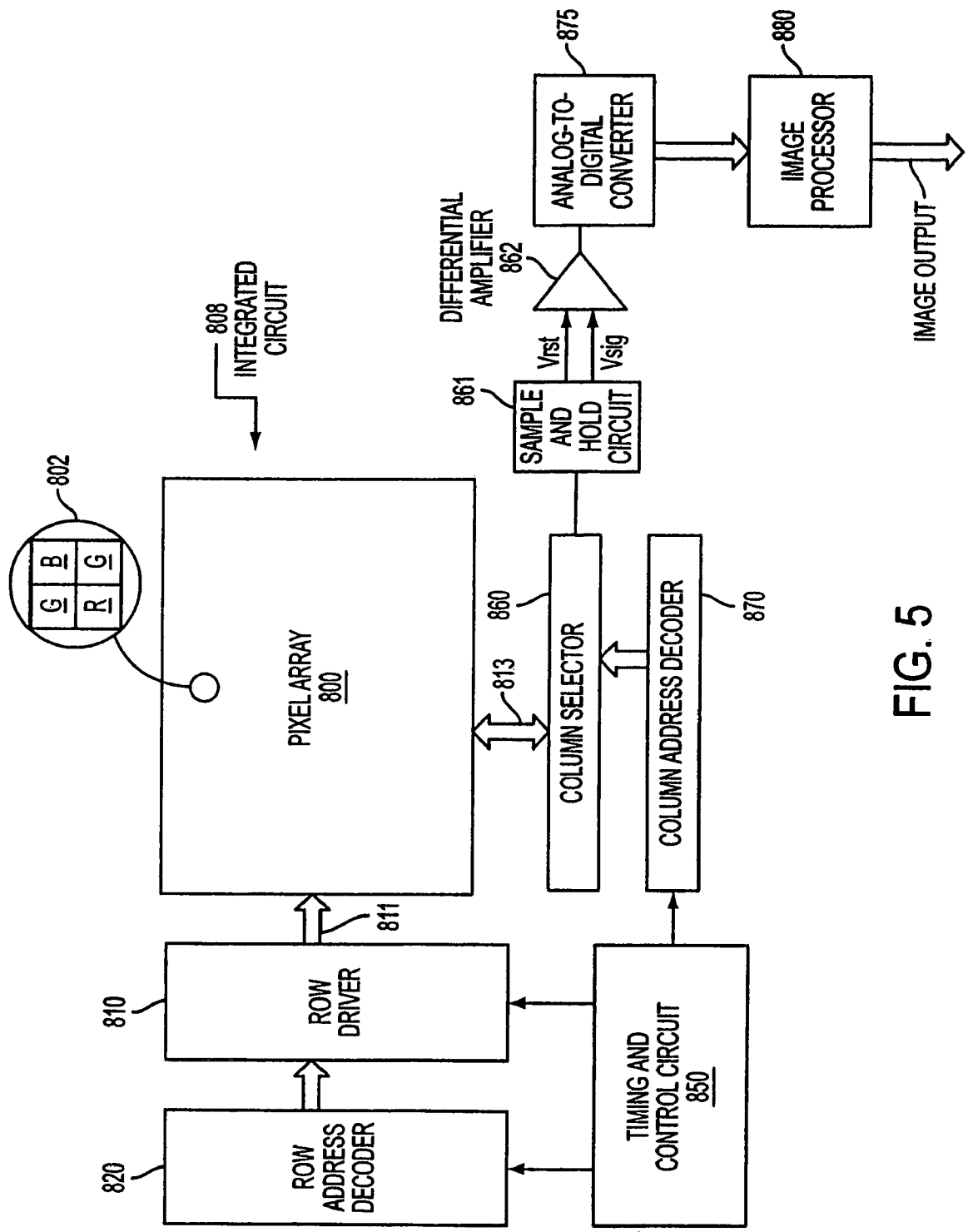
FIG. 5 is a block diagram of a CMOS imager integrated circuit (IC) having a pixel array constructed according to an exemplary embodiment of the invention.

FIG. 5 illustrates a block diagram of a CMOS imager integrated circuit (IC) 808 having a pixel array 800 containing a plurality of pixels arranged in rows and columns, including a region 802 with, for example, two green pixels (G), one blue pixel (B), and one red pixel (R) arranged in a Bayer pattern. The pixels of each row in array 800 are all turned on at the same time by row select lines 811, and the pixels of each column are selectively output by respective column select lines 813.

The row lines 811 are selectively activated by a row driver 810 in response to row address decoder 820. The column select lines 813 are selectively activated by a column selector 860 in response to column address decoder 870. The pixel array 800 is operated by the timing and control circuit 850, which controls address decoders 820, 870 for selecting the appropriate row and column lines for pixel signal readout.

The pixel column signals, which typically include a pixel reset signal ($V_{rst}$) and a pixel image signal ($V_{sig}$), are read by a sample and hold circuit 861 associated with the column selector 860. A differential signal ($V_{rst}$-$V_{sig}$) is produced by differential amplifier 862 for each pixel that is amplified and digitized by analog-to-digital converter 875 (ADC). The analog-to-digital converter 875 supplies the digitized pixel signals to an image processor 880.

Figure 6:
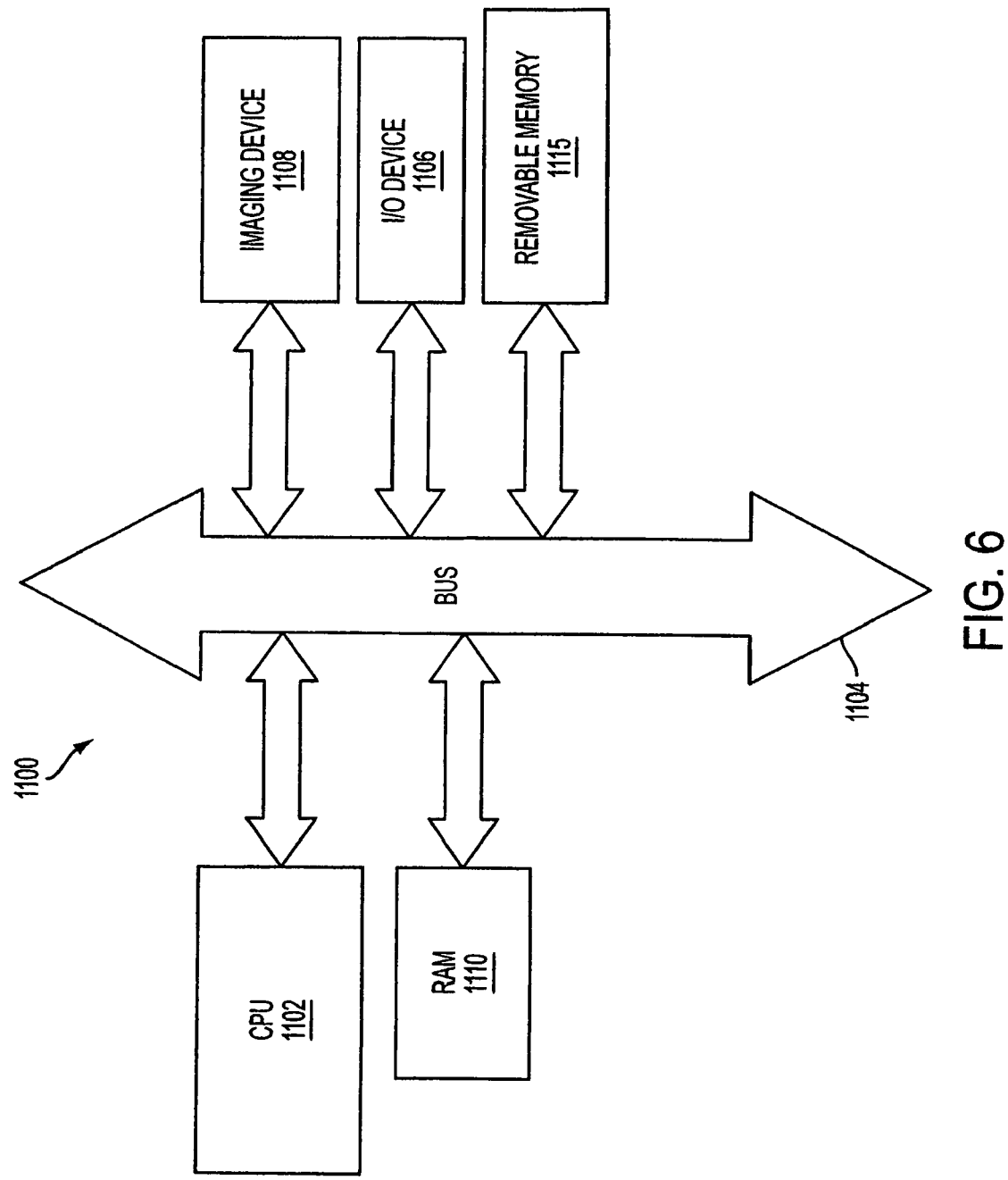
FIG. 6 is a schematic diagram of a computer processor system that may include a CMOS imager IC as in FIG. 5.

If desired, the imaging device 808 described above with respect to FIG. 5 may be combined with other components in a single integrated circuit. FIG. 6 illustrates an exemplary processor system 1100 which may include a CMOS imager or other imaging device 1108 incorporating features illustrated in FIGS. 1-5. Examples of processor systems include, without limitation, computer systems, camera systems, scanners, machine vision systems, vehicle navigation systems, video telephones, surveillance systems, auto focus systems, star tracker systems, motion detection systems, image stabilization systems, and data compression systems for high-definition television, any of which could utilize the invention.

The system 1100, for example, a digital camera system, includes an imaging device 1108 (FIG. 6) comprising a pixel array containing at least one light block material 180 formed in accordance with any of the various embodiments of the invention. The system 1100 generally comprises a central processing unit (CPU) 1102, such as a microprocessor, that communicates with an input/output (I/O) device 1106 over a bus 1104. Imaging device 1108 also communicates with the CPU 1102 over the bus 1104. The system 1100 also includes random access memory (RAM) 1110, and can include removable memory 1115, such as flash memory, which also communicates with CPU 1102 over the bus 1104. Imaging device 1108 may be combined with a processor, such as a CPU, digital signal processor, or microprocessor, with or without memory storage on a single integrated circuit or on a different chip than the processor.

While the above-described embodiments of the invention relate to imagers formed with light block materials to enhance the characteristics of image acquisition, one skilled in the art will recognize that the broad scope of the invention includes various other types of imager devices separately or integrated with one or more processing components in a semiconductor device. For example, although the invention is described above for use in a CMOS image sensor, the broad scope of the invention is not limited to such and may be applicable to any suitable image sensor, for example, CCD image sensors. The above-described array embodiments include red, green, and blue pixels, but monochrome or dichrome arrays or other multichrome arrays with these or other wavelength ranges in the visible or invisible EM spectrum could also be implemented with embodiments of the invention.

The above description and drawings illustrate embodiments which achieve the objects of the present invention. Although certain advantages and embodiments have been described above, those skilled in the art will recognize that substitutions, additions, deletions, modifications and/or other changes may be made without departing from the spirit or scope of the invention. Accordingly, the invention is not limited by the foregoing description but is only limited by the scope of the appended claims.

What is claimed as new and desired to be protected by Letters Patent of the United States is:

1. A method of fabricating a pixel array in a CMOS imaging device, comprising:
    forming a plurality of photosensors;
    forming a plurality of lenses over said plurality of photosensors;
    forming a material layer over and between said plurality of lenses; and
    removing first portions of said material layer to expose at least an outer surface of each lens, wherein second portions of said material layer remain surrounding each lens in the completed pixel array, said second portions capable of either absorbing or reflecting substantially all light incident on said second portions.

2. The method of claim 1, wherein the outer surface of each lens is a substantially curved outer surface.

3. The method of claim 1, wherein said second portions comprise a material that absorbs light incident on said second portions.

4. The method of claim 1, wherein said second portions comprise a material that absorbs substantially all light incident on said second portions.

5. The method of claim 1, wherein said second portions comprise a material that reflects light incident on said second portions.

6. The method of claim 1, wherein said second portions comprise a material that reflects substantially all light incident on said second portions.

7. The method of claim 1, wherein said material layer comprises at least one layer of black photoresist.

8. The method of claim 1, wherein said material layer comprises at least one metal layer.

9. The method of claim 8, wherein said at least one metal layer comprises aluminum.

10. The method of claim 1, wherein said second portions are below an upper level of each said lens.

11. The method of claim 10, wherein said second portions have a generally planar upper surface.

12. The method of claim 1, wherein said second portions extend above an upper level of each said lens to block light incident on said second portions.

13. The method of claim 12, wherein said second portions have generally planar upper and sidewall surfaces.

14. A method of fabricating a pixel array in a CMOS imaging device, comprising:
forming a material layer over and between a plurality of lenses; and
removing first portions of said material layer to expose at least an outer surface of each lens, wherein second portions of said material layer partially cover each lens in the completed pixel array.

15. The method of claim 14, wherein the outer surface of each lens is a substantially curved outer surface.

16. The method of claim 14, wherein said second portions comprise a material that absorbs light incident on said second portions.

17. The method of claim 14, wherein said second portions comprise a material that absorbs substantially all light incident on said second portions.

18. The method of claim 14, wherein said second portions comprise a material that reflects light incident on said second portions.

19. The method of claim 14, wherein said second portions comprise a material that reflects substantially all light incident on said second portions.

20. The method of claim 14, wherein said material layer comprises at least one layer of black photoresist.

21. The method of claim 14, wherein said material layer comprises at least one metal layer.

22. The method of claim 21, wherein said at least one metal layer comprises aluminum.

23. The method of claim 14, wherein said second portions are below an upper level of each said lens.

24. The method of claim 23, wherein said second portions have a generally planar upper surface.

25. The method of claim 14, wherein said second portions extend above an upper level of each said lens.

26. The method of claim 25, wherein said second portions have generally planar upper and sidewall surfaces.

27. A method of enhancing light transmission to a photo-sensor in an imaging device, comprising:
exposing outer surfaces of lenses, wherein second portions of a material layer surround each lens; and
transmitting light through said lenses, such that said second portions of said material layer block light from entering said imaging device.

28. The method of claim 27, wherein said second portions comprise a material that absorbs light incident on said second portions.

29. The method of claim 28, wherein said second portions comprise a material that absorbs substantially all light incident on said second portions.

30. The method of claim 27, wherein said second portions comprise a material that reflects light incident on said second portions.

31. The method of claim 30, wherein said second portions comprise a material that reflects substantially all light incident on said second portions.

32. The method of claim 27, wherein said material layer comprises at least one layer of black photoresist.

33. The method of claim 27, wherein said at least one material comprises at least one metal layer.

34. The method of claim 33, wherein said at least one metal layer comprises aluminum.

35. The method of claim 27, wherein said second portions are below an upper level of each said lens.

36. The method of claim 35, wherein said second portions have a generally planar upper surface.

37. The method of claim 27, wherein said second portions extend above an upper level of each said lens.

38. The method of claim 37, wherein said second portions have generally planar upper and sidewall surfaces.

* * * * *

UNITED STATES PATENT AND TRADEMARK OFFICE
CERTIFICATE OF CORRECTION

| | |
|---|---|
| PATENT NO. | : 7,662,656 B2 |
| APPLICATION NO. | : 11/496418 |
| DATED | : February 16, 2010 |
| INVENTOR(S) | : Loriston Ford |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 746 days.

Signed and Sealed this

Thirtieth Day of November, 2010

David J. Kappos
*Director of the United States Patent and Trademark Office*